(12) United States Patent
Xue et al.

(10) Patent No.: US 12,068,017 B2
(45) Date of Patent: Aug. 20, 2024

(54) CONFIGURABLE INPUT FOR AN AMPLIFIER

(71) Applicant: Micron Technology, Inc., Boise, ID (US)

(72) Inventors: Ruyan Xue, Shanghai (CN); Weilu Chu, Shanghai (CN); Zhiqi Huang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 277 days.

(21) Appl. No.: 17/647,151

(22) Filed: Jan. 5, 2022

(65) Prior Publication Data

US 2023/0215487 A1    Jul. 6, 2023

(51) Int. Cl.
*G11C 16/04* (2006.01)
*G06F 3/06* (2006.01)
*G11C 11/22* (2006.01)
*G11C 11/407* (2006.01)
*H03F 3/45* (2006.01)
*H03K 17/687* (2006.01)

(52) U.S. Cl.
CPC .......... *G11C 11/407* (2013.01); *G06F 3/0604* (2013.01); *G06F 3/0655* (2013.01); *G06F 3/0679* (2013.01); *G11C 11/225* (2013.01); *H03F 3/45269* (2013.01); *H03F 3/45273* (2013.01); *H03K 17/6872* (2013.01); *H03K 17/6874* (2013.01); *G11C 11/221* (2013.01)

(58) Field of Classification Search
CPC ............................ G11C 11/407; G11C 11/225
See application file for complete search history.

(56) References Cited

U.S. PATENT DOCUMENTS

| | | | |
|---|---|---|---|
| 9,473,163 B1* | 10/2016 | Tsai | H03F 3/45183 |
| 10,381,992 B1* | 8/2019 | Reitsma | H03L 7/087 |
| 2015/0364183 A1* | 12/2015 | Seo | G11C 11/417 |
| | | | 365/156 |
| 2018/0254750 A1* | 9/2018 | Matsuno | H03F 1/3211 |

\* cited by examiner

*Primary Examiner* — Pho M Luu
(74) *Attorney, Agent, or Firm* — Holland & Hart LLP (57) ABSTRACT

Methods, systems, and devices for configurable input for an amplifier are described. In some examples, a circuit may be configured to operate based on a signal having a first voltage profile or a second voltage profile. For example, the first voltage profile may be associated with a range of voltages that are based on a temperature of an associated memory chip, and the second voltage profile may be associated with a voltage (or voltages) that are not associated with the temperature of the memory chip. The circuit may include one or more transistors and switches that are activated based on the voltage profile and a switch receiving a particular control signal. In some instances, the control signal may be received based on a value stored to one or more non-volatile memory elements.

20 Claims, 6 Drawing Sheets

CONFIGURABLE INPUT FOR AN AMPLIFIER

FIELD OF TECHNOLOGY

The following relates generally to one or more systems for memory and more specifically to configurable input for an amplifier.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Semiconductor manufacturing is subject to variation of fabrication parameters used in applying an integrated circuit design to a semiconductor wafer. Process corners represent the extremes of these parameter variations, and generally cover the range within which circuits fabricated onto the wafer should function correctly. A circuit running on devices fabricated at these process corners may run slower or faster than at a nominal process condition, and is expected to function across the specified temperature and voltage ranges.

In some instances, a first process corner (e.g., a fast-slow (FS) corner) may refer to certain transistors (e.g., NMOS) having characteristics (e.g., threshold voltage, transconductance) for fast operation while other transistors (e.g., PMOS) have the characteristics for slow operation. In other corners, the types of transistors may both be fast (e.g., fast-fast (FF), or slow (e.g., slow-slow (SS), or the speed difference may be reversed (e.g., slow-fast (SF)). Generally, using fixed reference voltages for amplifiers and comparators across all process corners, as well as across specified temperature and supply voltage ranges, may result in performance degradation or operational failures. For example, use of a fixed reference voltage when the threshold voltage (e.g., Vt) of a transistor is high may result in the transistor operating in the sub-threshold region. Accordingly, when operating under such conditions, the circuit may not function properly.

In some cases, circuits may use a fixed reference voltage under some process conditions and a variable reference voltage under other process conditions. For example, a circuit may receive a voltage that is based on a temperature of the associated device for some process conditions. That is, the voltage may be higher when the temperature of the memory chip is relatively low and vice versa. When operating in some conditions using a variable reference voltage, however, the drain-source voltage (e.g., the Vds) of the transistor may be undesirably low. Accordingly, when operating under such conditions, the circuit may not function properly. Thus, in some cases even using a fixed reference voltage for some process corners and a variable reference voltage at other process corners may not provide satisfactory operation across the specified ranges of temperature and voltage.

In some examples, a fabrication process may include different types of transistors. For example, different types of transistors may have different properties (e.g., gate oxide thickness) for use in different circuits or with different voltages. As described herein, a circuit may include different types of transistors which may be selected at different process corners to mitigate or eliminate issues resulting from an undesirably low Vds or operation in a sub-threshold region. For example, a circuit may include a transistor of a first type coupled with a first switch and a transistor of a second type coupled with a second switch. The types and properties of the transistors may be selected such that, when the circuit receives a voltage based on a temperature of the associated memory chip the first switch and the first transistor may be activated. Moreover, when the circuit receives a voltage that is not based on a temperature of the associated memory chip, the second switch and the second transistor may be activated.

Accordingly, the Vds of the first transistor may be high enough to allow the circuit to function properly when it receives a temperature-dependent voltage. Further, the voltage received by the second transistor may be sufficiently higher than its Vt when it receives a non-temperature-dependent voltage and may not operate in a sub-threshold region. Thus by including different types of transistors at different process corners, the circuit may mitigate or eliminate issues resulting from an undesirably low Vds or a gate voltage being close to or below a Vt that would otherwise cause the transistor to operate in a sub-threshold region.

Features of the disclosure are initially described in the context of systems and dies as described with reference to FIGS. 1 and 2. Features of the disclosure are described in the context of circuits and a temperature slope for a reference signal as described with reference to FIGS. 3-5B. These and other features of the disclosure are further illustrated by and described with reference to a flowchart that relates to configurable input for an amplifier as described with reference to FIG. 6.

Figure 1:
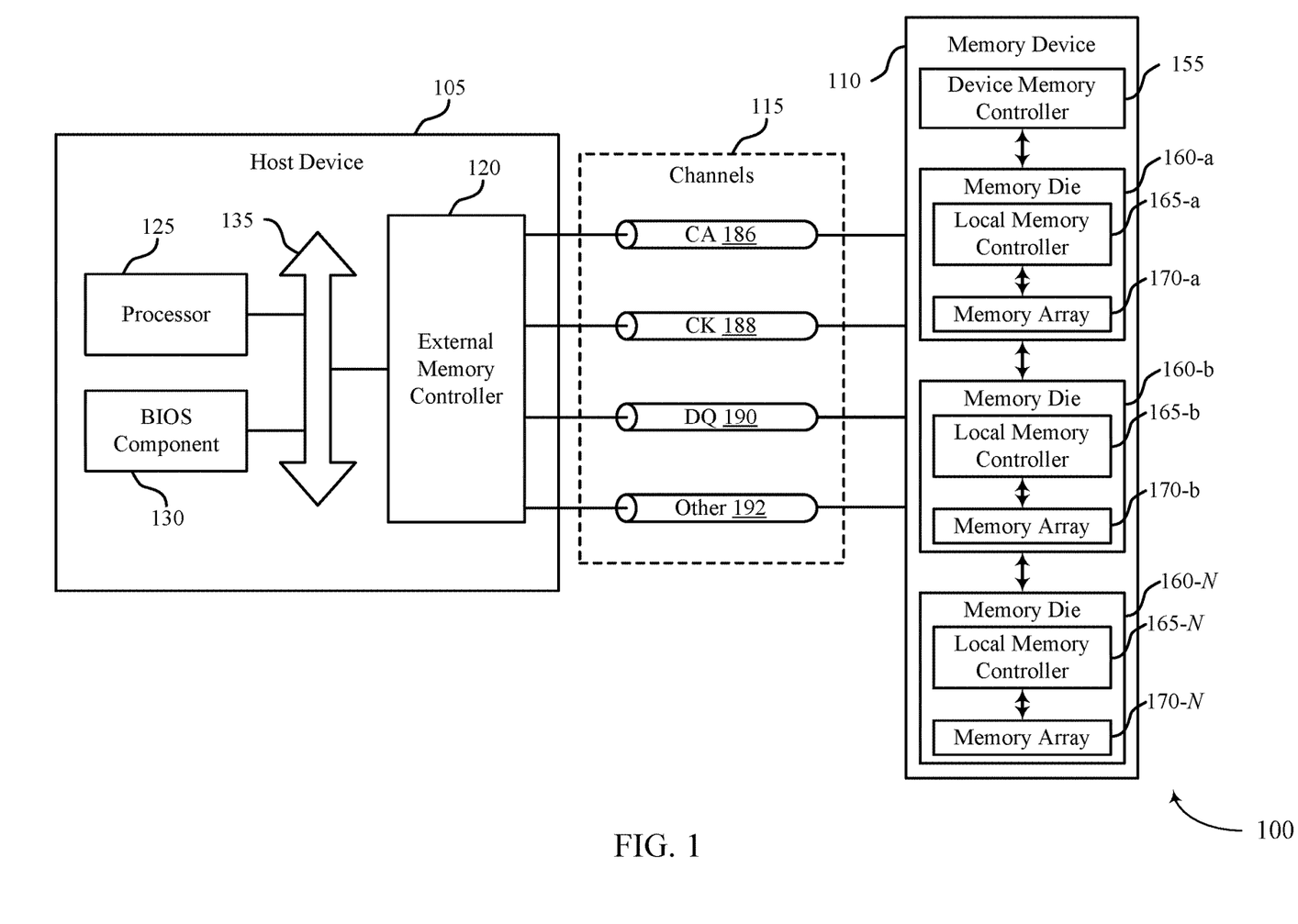
FIG. 1 illustrates an example of a system that supports configurable input for an amplifier in accordance with examples as disclosed herein.

FIG. 1 illustrates an example of a system 100 that supports configurable input for an amplifier in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device 110. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may include circuit configured to be operated as a comparator or an amplifier. The circuit may include one or more transistors and one or more switches and may be configured to operate based on receiving a voltage having a first voltage profile or a second voltage profile. In some instances, the first voltage profile may be associated with a temperature of the memory device 110, whereas the second voltage profile may be independent (e.g., relatively independent) of a temperature of the memory device.

The circuit may include at least two transistors that are configured in parallel and are each coupled with at least one switch. The switches may each be coupled with a respective control signal that is configured to be activated based on the voltage profile being associated with a temperature of the memory device 110 (or not being associated with a temperature of the memory device 110). For example, a first switch may receive a first control signal and a first transistor, when selected, may receive a voltage that is dependent on a temperature of the memory device 110. In other examples, a second switch may receive a second control signal and a second transistor, when selected, may receive a voltage that is not dependent on a temperature of the memory device 110. In some examples, the voltage that is dependent on temperature may vary greater than a threshold amount across an operation temperature range, where the threshold amount may be 50 mV, 100 mV, or 200 mV. In some examples, the voltage that is not dependent on the temperature of the memory device 110 may be constant, fixed, or may not vary substantially (e.g., may have less than a threshold amount of variation across an operation temperature range, where the threshold amount may be 2 mV, 5 mV, 10 mV, 25 mV, or 50 mV).

When operating as an comparator, the circuit may compare an input voltage with the temperature-dependent or non-temperature dependent voltage received by a respective transistor. Additionally or alternatively, when operating as an amplifier, the circuit may receive an input voltage and output a voltage that is equal to, is divided (e.g., less than the input voltage), or is amplified (e.g., greater than the input voltage).

In either instance, the Vds of the transistors included in the circuit may be high enough to allow the circuit to function properly when it receives a temperature-dependent voltage. Further, when a transistor of the circuit receives a non-temperature-dependent voltage, the voltage may be sufficiently higher than the transistor's Vt, and thus the transistor may not operate in a sub-threshold region. By including different types of transistors at different process corners of the circuit, the circuit may mitigate or eliminate issues resulting from an undesirably low Vds or operation in a sub-threshold region.

Figure 2:
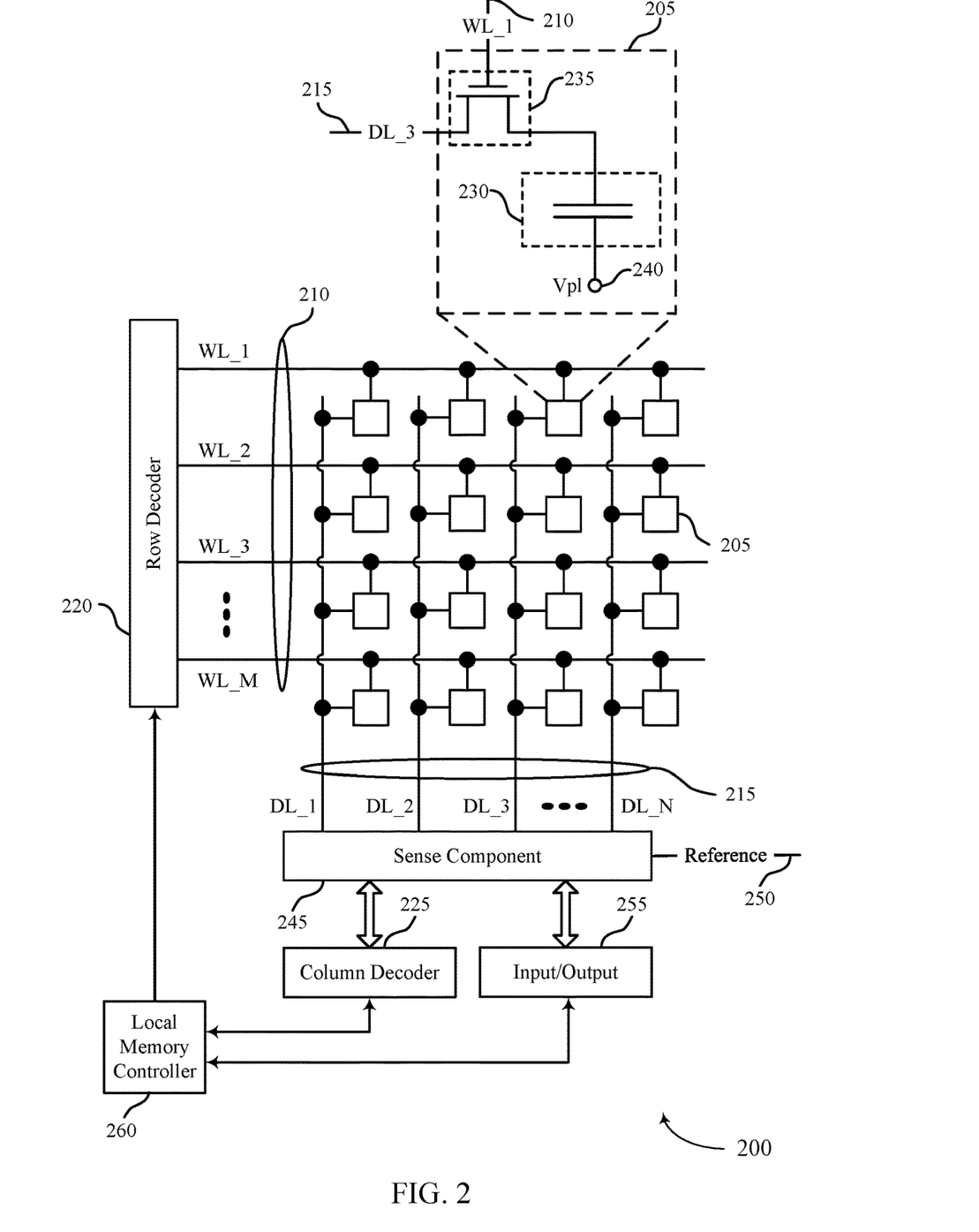
FIG. 2 illustrates an example of a memory die that supports configurable input for an amplifier in accordance with examples as disclosed herein.

FIG. 2 illustrates an example of a memory die 200 that supports configurable input for an amplifier in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some examples, the memory die 200 may include a circuit configured to be operated as a comparator or an amplifier. The circuit may include one or more transistors and one or more switches and may be configured to operate based on receiving a voltage having a first voltage profile or a second voltage profile. In some instances, the first voltage profile may be dependent on a temperature of the memory die 200, whereas the second voltage profile may be substantially independent of a temperature of the memory device.

The circuit may include at least two transistors that are configured in parallel and are each coupled with at least one switch. The switches may each be coupled with respective control signals that are configured to be activated based on the voltage profile being dependent on a temperature of the memory die 200, or activated based on the voltage profile being independent of a temperature of the memory die 200. For example, a first switch may receive a first control signal and a first transistor, when selected, may receive a voltage based on a temperature of the memory die 200. In other examples, a second switch may receive a second control signal and a second transistor, when selected, may receive a voltage that is not associated with a temperature of the memory die 200. In some examples, the voltage that is not associated with the temperature of the memory die 200 may be constant, fixed, or may not vary (e.g., more than a threshold amount) based on the temperature of the memory device.

When operating as a comparator, the circuit may compare an input voltage with the temperature-dependent or non-temperature dependent voltage received by a respective transistor. Additionally or alternatively, when operating as an amplifier, the circuit may receive an input voltage and output a voltage that is less than, equal to, or greater than the input voltage. The selection of which transistor is active for the comparator may be based on activating one or more of the switches.

In either instance, the Vds of the transistors included in the circuit may be high enough to allow the circuit to function properly when it receives a temperature-dependent voltage. Further, when a transistor of the circuit receives a non-temperature-dependent voltage, the voltage may be sufficiently higher than the transistor's Vt, and thus the transistor may not operate in a sub-threshold region. By including different types of transistors at different process corners of the circuit, the circuit may mitigate or eliminate issues resulting from an undesirably low Vds or sub-threshold region operation.

Figure 3:
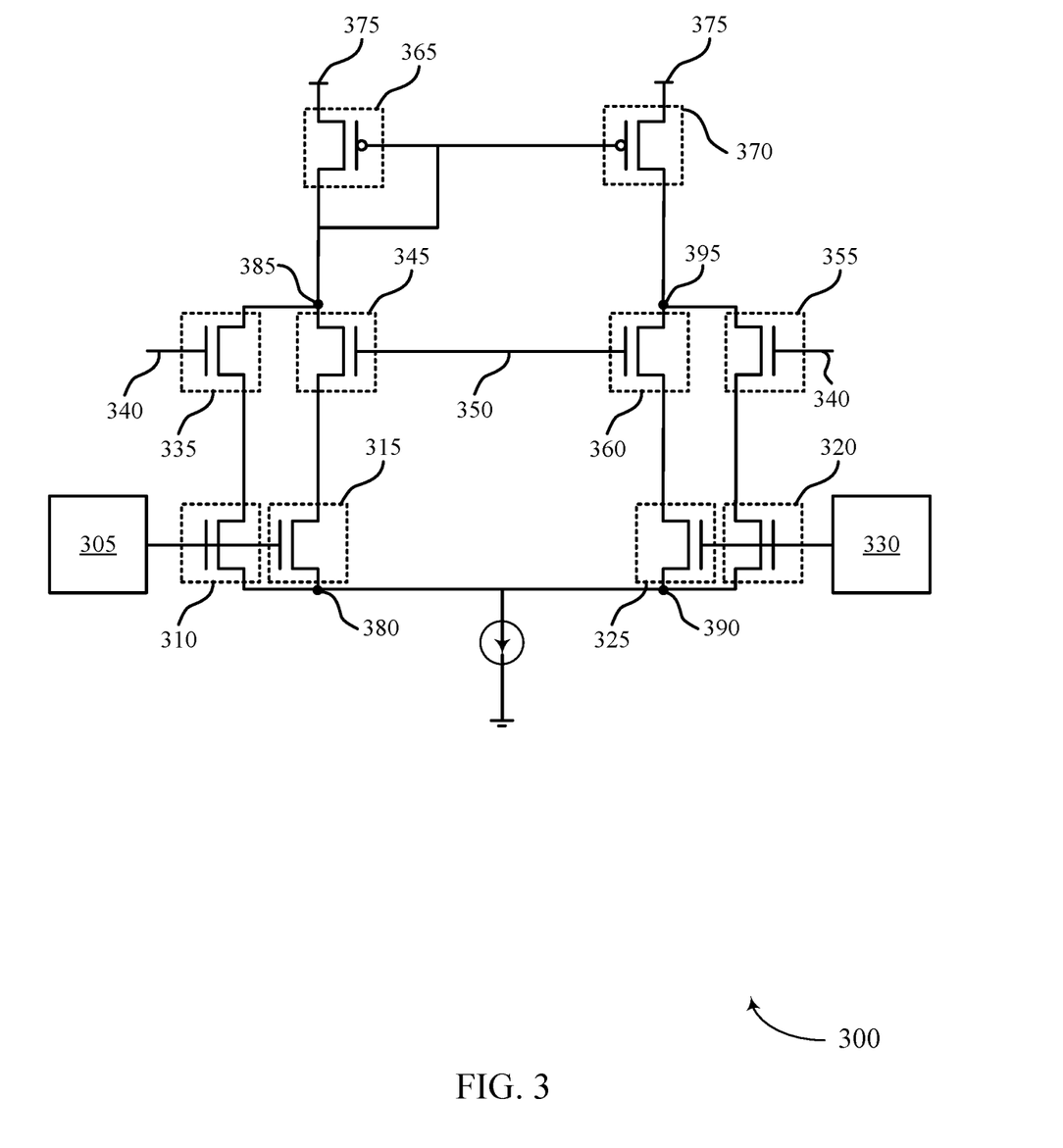
FIG. 3 illustrates an example of a circuit that supports configurable input for an amplifier in accordance with examples as disclosed herein.

FIG. 3 illustrates an example of a circuit 300 that supports configurable input for an amplifier in accordance with examples as disclosed herein. The circuit 300 may include various transistors that are activated based a control signal and a voltage profile of a signal (e.g., a first signal, a reference signal) received by the circuit 300. The circuit 300 may include a first input 305 that is configured to provide a first signal having a first voltage profile that is associated with a temperature slope (e.g., variable reference signal) or a second voltage profile that is associated with a non-temperature dependent slope (e.g., a fixed reference signal) to one or more transistors. The first signal may be applied to a gate of one or more transistors, and a particular transistor may be activated (e.g., turned on) or deactivated (e.g., turned off) based on a signal (e.g., a control signal) received by one or more switches. Accordingly, by activating a transistor configured to receive a first signal associated with a first voltage profile or a second voltage profile, the circuit 300 may be effectively operated without any transistors operating in a sub-threshold region or with an undesirably low Vds (e.g., drain-source voltage).

The circuit 300 may include a first transistor 310 and a second transistor 315 that are coupled with the first input 305 (e.g., a positive input 305) of the circuit 300. In some examples, the first transistor 310 and the second transistor 315 may each be n-channel (e.g., NMOS) transistors and may be configured in parallel. In other examples, however, the first transistor 310 and the second transistor 315 may be different types of transistors. Moreover, the first transistor 310 and the second transistor 315 may each be associated with a different threshold voltage (e.g., a different Vt). For example, the first transistor 310 may have a thicker (e.g., a different) gate oxide than the second transistor 315 and thus may be associated with a higher Vt than the second transistor 315. The thickness of the first transistor 310 and the second transistor 315 may be based on a manufacturing process of the respective transistor. That is, different manufacturing processes may result in different types of transistors having different characteristics (e.g., different oxide thicknesses). In some examples, a respective transistor may be activated (e.g., enabled in the circuit 300) based on a voltage of the first signal and a control signal applied to the circuit 300.

The circuit 300 may also include a third transistor 320 and a fourth transistor 325 that are coupled with the second input 330 (e.g., a negative input 330) of the circuit 300. In some examples, the third transistor 320 and the fourth transistor 325 may each be n-channel (e.g., NMOS) transistors and may be configured in parallel. In other examples, however, the third transistor 320 and the fourth transistor 325 may be different types of transistors. Moreover, the third transistor 320 and the fourth transistor 325 may each be associated with a different threshold voltage (e.g., a different Vt). For example, the third transistor 320 may have a thicker (e.g., a different) gate oxide than the fourth transistor 325 and thus may be associated with a higher Vt than the fourth transistor 325. Moreover, the first transistor 310 and the third transistor 320 may have a same or a similar gate oxide thickness (e.g., a same or similar Vt) and the second transistor 315 and the fourth transistor 325 may have a same or a similar gate oxide thickness. However, as described above, the gate oxide of each of the first transistor 310, the second transistor 315, the third transistor 320, and the fourth transistor 325 may be based on a particular manufacturing process (or processes), which may result in a respective transistor being activated (e.g., turned on) based on a voltage of the first signal and a control signal applied to the circuit 300.

Figure 4:
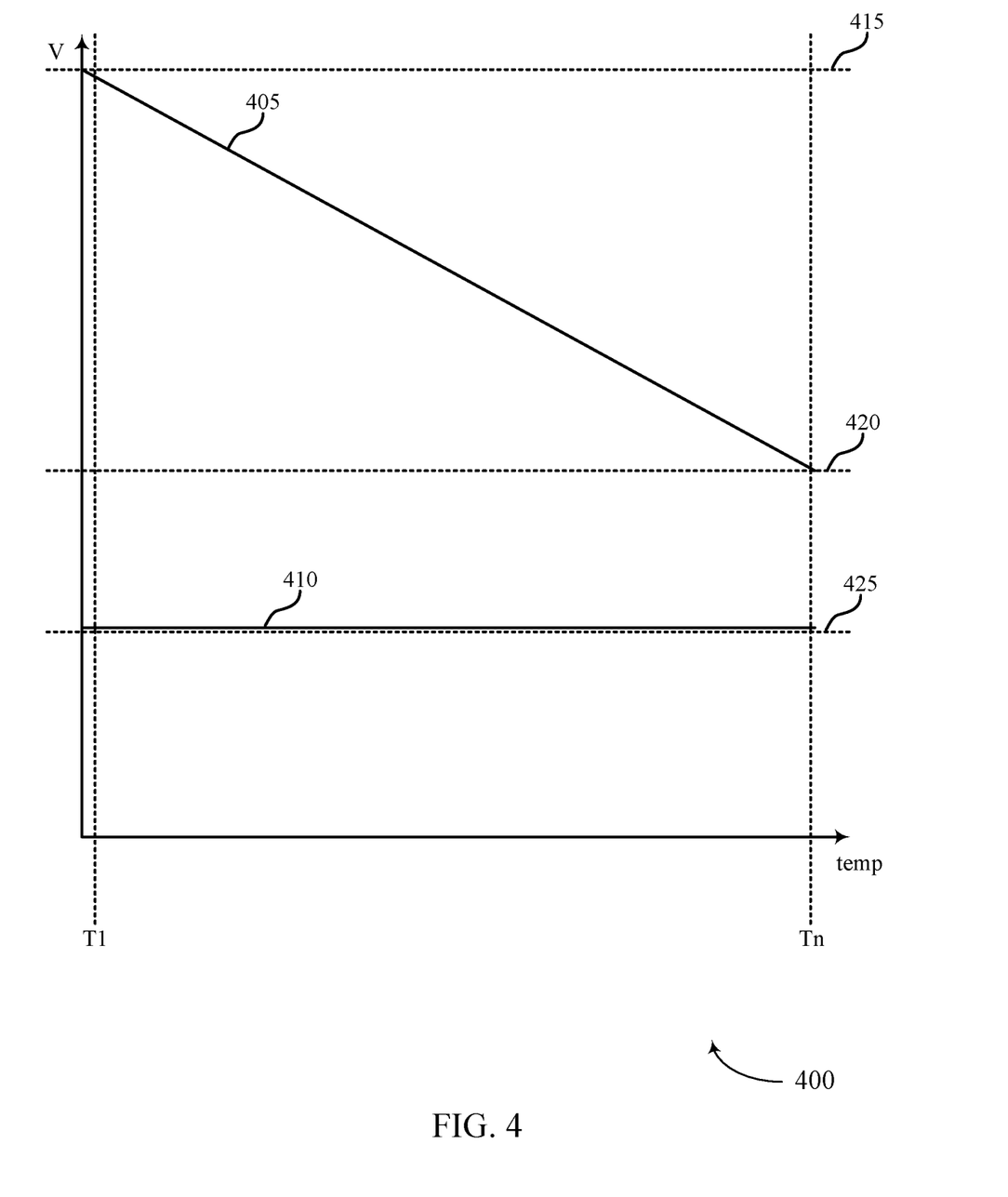
FIG. 4 illustrates an example of a temperature slope for a reference signal that supports configurable input for an amplifier in accordance with examples as disclosed herein.

The first input 305 may be configured to provide a first signal to the first transistor 310 and the third transistor and the second input 330 may be configured to provide a second signal to the second transistor 315 and the fourth transistor 325. For example, as shown in FIG. 4, the first signal may have a first voltage profile 405 or a second voltage profile 410. In some examples, the first voltage profile 405 may be associated with a temperature slope and the second voltage profile 410 may be associated with a non-temperature slope. The first voltage profile 405 may be associated with a negative slope such that, at lower temperature values (e.g., lower temperature values of an associated memory chip), the voltage of the first signal having the first voltage profile 405 may be relatively higher and at higher temperature values the voltage of the first signal may be relatively lower. Additionally or alternatively, the second voltage profile 410 may not be associated with a temperature slope. That is, the voltage of the first signal having the second voltage profile 410 may be constant, fixed, or may not vary substantially based on the temperature of the memory device (e.g., may have less than a threshold amount of variation across an operation temperature range, where the threshold amount may be 2 mV, 5 mV, 10 mV, 25 mV, or 50 mV). In some instances, the voltage of the first signal having the second voltage profile 410 may vary between T1 and Tn (e.g., the second voltage profile 410 may be somewhat convex or concave) but variation from end-to-end may be relatively low. Thus, despite the second voltage profile 410 being illustrated as substantially constant in FIG. 4, the second voltage profile 410 may be any shape or have any voltage value (or values) having a relatively low variation across the temperature range (e.g., as compared to the first voltage profile 405).

The circuit 300 may include one or more switches coupled with the first transistor 310, the second transistor 315, the third transistor 320, and the fourth transistor 325. For example, the circuit 300 may include a first switch 335 that is coupled with a first control signal 340 and the first transistor 310 and a second switch 345 that is coupled with a second control signal 350 and the second transistor 315. Additionally or alternatively, the circuit 300 may include a third switch 355 that is coupled with the first control signal 340 and the third transistor 320 and a fourth switch 360 that is coupled with the second control signal 350 and the fourth transistor 325. In some examples, the first control signal 340 may be associated with the first voltage profile 405 and the second control signal 350 may be associated with the second voltage profile 410. That is, when the circuit 300 is operating in a temperature-slope mode the first control signal 340 may be asserted to activate the first switch 335, the third switch 355, or both, and when the circuit 300 is operating in a non-temperature-slope mode the second control signal 350 may be asserted to activate the second switch 345, the fourth switch 360, or both.

In some examples, the circuit 300 may include or may be coupled with one or more non-volatile read-only memory cells (e.g., a bank of cells). The one or more non-volatile read-only memory cells may be or may include fuses or anti-fuses that are configured to store data indicating whether to activate the first control signal 340 or the second control signal 350. For example, the one or more non-volatile read-only memory cells may store a first value or a second value. If the one or more non-volatile read-only memory cells stores the first value, the first control signal 340 may be asserted (e.g., may be high or VDD) and may activate the first switch 335 and the third switch 355 while the second control signal 350 may be de-asserted (e.g., may be low or VSS), and thus the second switch 345 and the fourth switch 360 may not be activated.

In other examples, if the one or more non-volatile read-only memory cells stores the second value, the second control signal 350 may be asserted and may activate the second switch 345 and the fourth switch 360 while the first control signal 340 is de-asserted, and thus the first switch 335 and the third switch 355 may not be activated. In some examples, the one or more non-volatile read-only memory cells may store any value and thus whether the stored value activates or deactivates a respective control signal may be a matter of design choice.

The circuit 300 may also include a fifth transistor 365 and a sixth transistor 370 that are coupled with a voltage source 375 (e.g., VDD). In some examples, the fifth transistor 365 and the sixth transistor 370 may each be p-channel (e.g., PMOS) transistors. In other examples, however, the fifth transistor 365 and the sixth transistor 370 may be different types of transistors. Additionally or alternatively, the fifth transistor 365 and the sixth transistor 370 may be or may be included in a current mirror that is configured to provide current from the voltage source 375 to one or more nodes of the circuit 300.

In some examples, the circuit 300 may include one or more other nodes. For example, the circuit 300 may include a first node 380 that is coupled with the first transistor 310 and the second transistor 315. In some instances, the first node 380 may be coupled with a source of the first transistor 310 and a source of the second transistor 315. The circuit 300 may also include a second node 385 that is coupled with the first switch 335, the second switch 345, and the fifth transistor 365. In some instances, the second node 385 may be coupled with a drain of the fifth transistor 365.

Additionally or alternatively, the circuit 300 may include a third node 390 that is coupled with the third transistor 320 and the fourth transistor 325. The third node 390 may be a same node as the first node 380. In some instances, the third node 390 may be coupled with a source of the third transistor 320 and a source of the fourth transistor 325 and may be a same node as the first node 380. The circuit 300 may also include a fourth node 395 that is coupled with the third switch 355, the fourth switch 360, and the sixth transistor 370. In some instances, the fourth node 395 may be coupled with a drain of the sixth transistor 370.

As described herein, during fabrication of the circuit 300, some corners (e.g., some process corners) may benefit from utilizing a first signal (e.g., a reference signal) having a first voltage profile 405, while other corners may benefit from utilizing a reference signal having a second voltage profile 410. That is, the voltage of both reference signals (e.g., the reference signal having the first voltage profile 405 and the second voltage profile 410) may be generated using a bandgap voltage, but the first voltage profile 405 may vary based on the temperature of the memory device, whereas the second voltage profile 410 may not vary (or may vary a relatively low amount) based on the temperature of the memory device.

For example, the first transistor 310 and the third transistor 320 may have a higher Vt and may benefit from utilizing a reference signal having the first voltage profile 405 to prevent the respective transistors from operating in a sub-threshold region. Moreover, the second transistor 315 and the fourth transistor 325 may have a lower Vt and may benefit from utilizing a reference signal having the second voltage profile 410 to prevent the Vds (e.g., drain-source voltage) of the respective transistors from being too small. By preventing the respective transistors from operating in a sub-threshold region or having an undesirably low Vds, the circuit 300 may be effectively operated without experiencing issues that may otherwise arise due to a variation of fabrication parameters.

By way of example, the circuit 300 may operate in a temperature slope mode (e.g., using the reference signal having the first voltage profile 405). The circuit 300 may operate in the temperature slope mode based on the one or more non-volatile read-only memory cells storing a first value. Accordingly, the first control signal 340 may be asserted (e.g., driven high), which may activate the first switch 335. Moreover, the first input 305 (or the second input 330) may provide a first signal having a voltage based on a temperature of the associated memory chip to the gate of the first transistor 310 (or the gate of the second transistor 315). For example, as shown in FIG. 4, a value of the voltage of the reference signal having the first voltage profile 405 may be between a first voltage 415 (e.g., at T1) and a second voltage 420 (e.g., at Tn). For exemplary purposes, the first voltage 415 may be relatively high (e.g., at or around 1.0V) at −40 C (e.g., at T1) and the second voltage 420 may be relatively lower (e.g., below 1.0V) at 130 C (e.g., at Tn).

As described herein, the Vt of the first transistor 310 and the third transistor 320 may be lower than the first voltage at −40C and 130C. Accordingly, applying the first signal having a voltage that varies by more than a threshold (e.g., 50 mV, 100 mV, 150 mV, 200 mV) to first transistor 310 or the third transistor 320 may activate the respective transistor and thus prevent the transistors from otherwise operating in a sub-threshold region. In other examples, if the circuit 300 included only the first transistor 310 and the third transistor 320 (e.g., if the circuit 300 did not include the second transistor 315 and the fourth transistor 325 for the non-temperature-slope mode), the first transistor 310 and the third transistor 320 may operate in a sub-threshold region when in the non-temperature-slope mode.

Additionally or alternatively, the circuit 300 may operate in a non-temperature slope mode (e.g., using the reference signal having the second voltage profile 410). The circuit 300 may operate in the non-temperature slope mode based on the one or more non-volatile read-only memory cells storing a second value (e.g., a value different than the first value). Accordingly, the second control signal 350 may be asserted (e.g., driven high), which may activate the second switch 345 (and the fourth switch 360). Moreover, the first input 305 (or the second input 330) may provide a first signal having a voltage that is not based on a temperature of the associated memory chip to the gate of the second transistor 315 (or the gate of the fourth transistor 325). For example, as shown in FIG. 4, a value of the voltage of the reference signal having the second voltage profile 410 may be at or near a third voltage 425 (e.g., between T1 and Tn). For exemplary purposes, the third voltage 425 may approximately 0.7V between −40 C and 130 C.

As described herein, the Vt of the second transistor 315 and the fourth transistor 325 may be at or around 0.5V. Accordingly, if the first signal (e.g., temperature-dependent signal) is applied to the first input 305, the lower Vt of the second transistor 315 would result in a voltage of the first node 380 that would be relatively high (e.g., around 0.5V), which would reduce the Vds of the second transistor 315 to a value that may impact performance of the circuit 300. However, if the second signal (e.g., non-temperature-dependent signal) is applied to the first input 305, the lower Vt of the second transistor maintains the second node 380 at or around a difference between the two voltages (e.g., at or around 0.2V). In this case, the voltage of the second node 385 (or the fourth node 395) may be at or around 0.7V, and thus the Vds (e.g., drain-source voltage) of the second transistor 315 and the fourth transistor 325 may be large enough for the circuit 300 to operate properly in a non-temperature dependent slope mode.

Figure 5A:
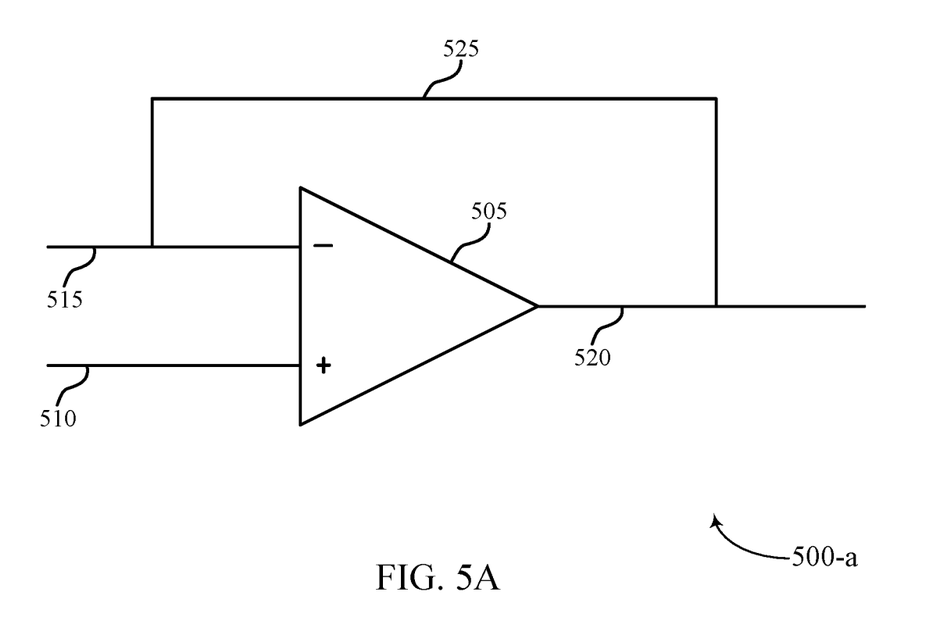
FIGS. 5A and 5B show circuits that support configurable input for an amplifier in accordance with examples as disclosed herein.

FIG. 5A illustrates an example of a circuit 500-a that supports configurable input for an amplifier in accordance with examples as disclosed herein. The circuit 500-a may include an amplifier 505, which may include aspects of the circuit 300 as described with reference to FIG. 3. For example, the circuit 500-a may include a first input 510 and a second input 515, which may be examples of the first input 305 and the second input 330, respectively, as described with reference to FIG. 3. Moreover, the amplifier 505 may include various transistors and switches coupled with the inputs as well as an output 520, as described with reference to FIG. 3. Utilizing the input stage (e.g., the first input stage or the second input stage) of the circuit 300 as an amplifier 505 may allow for the circuit 300 to operate within performance limits over a temperature range and thus may provide a desired output drive for the amplifier 505.

As described with reference to FIG. 3, the circuit 300 may include various transistors that are activated based a control signal and a voltage profile of a signal (e.g., a first signal, a reference signal) received by the circuit 300. The circuit 300 may be an example of or included within the amplifier 505 and may include a first input 510 that is configured to provide a first signal having a first voltage profile that is associated with a temperature slope (e.g., variable reference signal) or a second voltage profile that is associated with a non-temperature dependent slope (e.g., a fixed reference signal) to one or more transistors. The first signal may be applied to a gate of one or more transistors, and a particular transistor may be activated (e.g., enabled) or deactivated (e.g., deactivated) based on one or more control signals received by one or more switches. Accordingly, by activating a transistor configured to receive a first signal associated with a first voltage profile or a second voltage profile, the amplifier 505 may be effectively operated without any transistors operating in a sub-threshold region or with an undesirably low Vds (e.g., drain-source voltage).

In some instances, the first transistor 310, the second transistor 315, the first switch 335, and the second switch 345 may be associated with the first input 510 of the amplifier 505. Additionally or alternatively, the third transistor 320, the fourth transistor 325, the third switch 355, and the fourth switch 360 may be associated with the second input 515 of the amplifier 505. For example, the amplifier 505 may be configured to receive an input voltage and, based on receiving the input voltage, may output a voltage (e.g., an output voltage via output 520) that is greater than the input voltage. The voltage may be output from the amplifier based on activating the first switch, the second switch, the third switch, or the fourth switch.

For example, the amplifier may receive the input voltage at the first input 510. In some examples, either the first switch 335 or the second switch 345 may be activated based on receiving a respective control signal. Moreover, a first signal may be received at the gate of the first transistor 310 and the second transistor 315. The first signal may be provided by the first input 305. Based on the first switch 335 or the second switch 345 being activated, the voltage at the node 395 may be output from the amplifier 505 (e.g., via output 520).

When the circuit 300 is operated as an amplifier 505, the output voltage (e.g., at the output 520) may track the input voltage (e.g., at the input 510) by using feedback (e.g., via feedback line 525) from the output 520 to the negative input 515. Accordingly, if a voltage at the output 520 is higher than a voltage at the input 510, the feedback may result in the output voltage decreasing. Additionally or alternatively, if the output (e.g., the voltage at the output 520) is lower than the input, the feedback may result in the output voltage increasing. Utilizing the input stage (e.g., the first input stage or the second input stage) of the circuit 300 as an amplifier 505 for voltage generation or regulation (e.g., charge pumps, reference voltage generators, etc.), the circuit 300 may operate within performance limits over a temperature range and thus may provide a desired output drive for an amplifier.

Figure 5B:
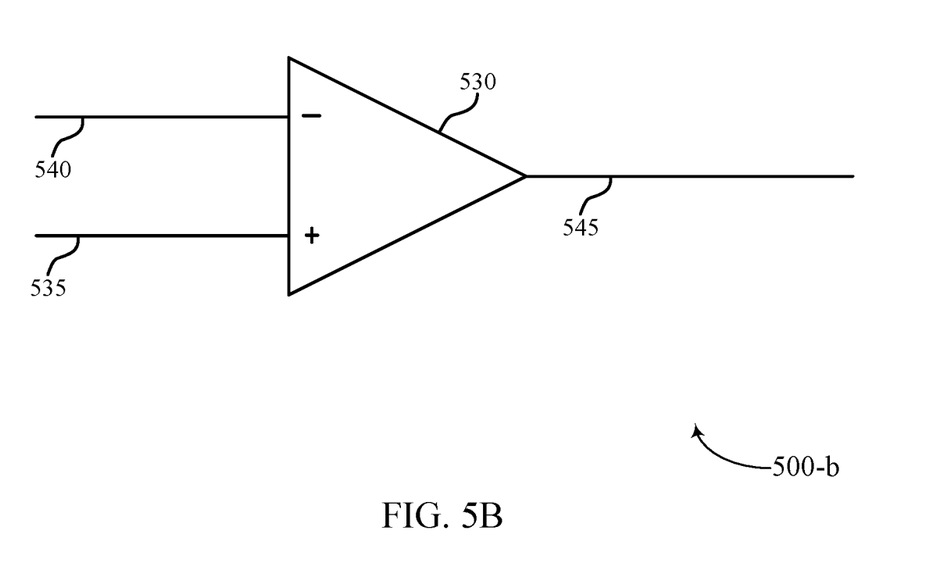

FIG. 5B illustrates an example of a circuit 500-b that supports configurable input for an amplifier in accordance with examples as disclosed herein. The circuit 500-b may include a comparator 530, which may include aspects of the circuit 300 as described with reference to FIG. 3. For example, the circuit 500-b may include a first input 535 and a second input 540, which may be examples of the first input 305 and the second input 330, respectively, as described with reference to FIG. 3. Moreover, the comparator 530 may include various transistors and switches coupled with the inputs as well as an output 545, as described with reference to FIG. 3. Utilizing the circuit 300 as a comparator 530 in circuits used for voltage generation or regulation (e.g., charge pumps, reference voltage generators, etc.), the circuit 300 may operate within performance limits over a temperature range and thus may provide a desired switching performance for the comparator 530.

As described herein with reference to FIG. 3, aspects of the circuit 300 may be used as a comparator 530. For example, the circuit 300 may output a voltage (e.g., at the node 395) which may swing based on whether the positive input 305 or the negative input 330 is higher. That is, if the positive input 305 is higher than the negative input 330, the circuit 300 may output a relatively high voltage at the node 395. If the negative input 330 is higher than the positive input 305, the circuit 300 may output a relatively low voltage at the node 395.

For example, a first signal may be received at the gate of the first transistor 310 and the second transistor 315. The first signal may be received at the first input 535 (positive input). The comparator 530 may then output a signal (e.g., an output signal via output 545) that is based on a difference between a second signal received at the second input 540 (negative input). Utilizing the circuit 300 as a comparator 530 in circuits used for voltage generation or regulation (e.g., charge pumps, reference voltage generators, etc.), the circuit 300 may operate within performance limits over a temperature range and thus may provide a desired switching performance for a comparator.

Figure 6:
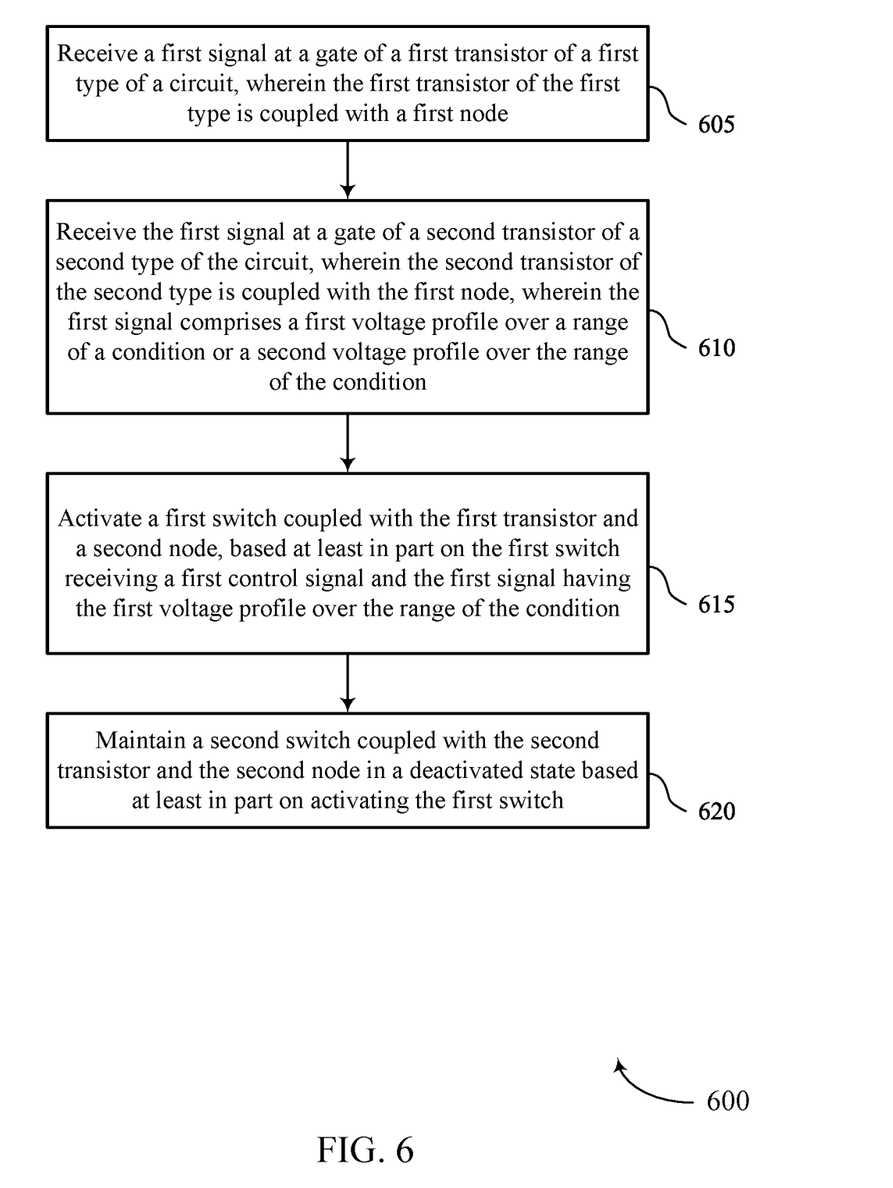
FIG. 6 shows a flowchart illustrating a method or methods that support configurable input for an amplifier in accordance with examples as disclosed herein.

FIG. 6 shows a flowchart illustrating a method 600 that supports configurable input for an amplifier in accordance with examples as disclosed herein. The operations of method 600 may be implemented by a circuit or its components as described herein. For example, the operations of method 600 may be performed by a circuit as described with reference to FIGS. 1 through 5. In some examples, a circuit may execute a set of instructions to control the functional elements of the device to perform the described functions. Additionally or alternatively, the circuit may perform aspects of the described functions using special-purpose hardware.

At 605, the method may include receiving a first signal at a gate of a first transistor of a first type of a circuit, where the first transistor of the first type is coupled with a first node. The operations of 605 may be performed in accordance with examples as disclosed herein.

At 610, the method may include receiving the first signal at a gate of a second transistor of a second type of the circuit, where the second transistor of the second type is coupled with the first node, where the first signal includes a first voltage profile over a range of a condition or a second voltage profile over the range of the condition. The operations of 610 may be performed in accordance with examples as disclosed herein.

At 615, the method may include activating a first switch coupled with the first transistor and a second node, based at least in part on the first switch receiving a first control signal and the first signal having the first voltage profile over the range of the condition. The operations of 615 may be performed in accordance with examples as disclosed herein.

At 620, the method may include maintaining a second switch coupled with the second transistor and the second node in a deactivated state based at least in part on activating the first switch. The operations of 620 may be performed in accordance with examples as disclosed herein.

In some examples, an apparatus as described herein may perform a method or methods, such as the method 600. The apparatus may include, features, circuitry, logic, means, or instructions (e.g., a non-transitory computer-readable medium storing instructions executable by a processor) for receiving a first signal at a gate of a first transistor of a first type of a circuit, where the first transistor of the first type is coupled with a first node, receiving the first signal at a gate of a second transistor of a second type of the circuit, where the second transistor of the second type is coupled with the first node, where the first signal includes a first voltage profile over a range of a condition or a second voltage profile over the range of the condition, activating a first switch coupled with the first transistor and a second node, based at least in part on the first switch receiving a first control signal and the first signal having the first voltage profile over the range of the condition, and maintaining a second switch coupled with the second transistor and the second node in a deactivated state based at least in part on activating the first switch.

Some examples of the method 600 and the apparatus described herein may further include operations, features, circuitry, logic, means, or instructions for reading data from a non-volatile memory element coupled with the circuit, where the first control signal may be configured to activate the first switch and a second control signal may be configured to deactivate the second switch based at least in part on reading a first value from the non-volatile memory element and the first control signal may be configured to deactivate the first switch and the second control signal may be configured to activate the second switch based at least in part on reading a second value from the non-volatile memory element.

In some examples of the method 600 and the apparatus described herein, the first transistor and the method, apparatuses, and non-transitory computer-readable medium may include further operations, features, circuitry, logic, means, or instructions for receiving an input voltage at a third node and outputting, from the amplifier, an output voltage that may be greater than the input voltage based at least in part on activating the first switch or activating the second switch.

Some examples of the method 600 and the apparatus described herein may further include operations, features, circuitry, logic, means, or instructions for receiving an input voltage at a third node, comparing the input voltage with a voltage of the first signal, and outputting, from the circuit, an output voltage based at least in part on a difference between the input voltage and the voltage of the first signal.

In some examples of the method 600 and the apparatus described herein, the first voltage profile of the first signal includes a first temperature slope and the second voltage profile of the first signal includes a second temperature slope that may be different than the first temperature slope.

It should be noted that the methods described herein describe possible implementations, and that the operations and the steps may be rearranged or otherwise modified and that other implementations are possible. Further, portions from two or more of the methods may be combined.

An apparatus is described. The apparatus may include a circuit including, a first transistor of a first type coupled with a first node and having a gate coupled with a first signal, a second transistor of a second type coupled with the first node and having a gate coupled with the first signal, a first switch coupled with the first transistor and a second node, where a first control signal for the first switch activates the first switch based at least in part on the first signal having a first voltage profile over a range of a condition, and a second switch coupled with the second transistor and the second node, where a second control signal for the second switch activates the second switch based at least in part on the first signal having a second voltage profile over the range of the condition.

In some examples, the apparatus may include a non-volatile memory element coupled with the circuit, where the first control signal may be configured to activate the first switch and the second control signal may be configured to deactivate the second switch based at least in part on the non-volatile memory element storing a first value and the first control signal may be configured to deactivate the first switch and the second control signal may be configured to activate the second switch based at least in part on the non-volatile memory element storing a second value.

In some examples of the apparatus, the circuit further includes a third transistor of the first type coupled with a third node and having a gate coupled with a second signal, a fourth transistor of the second type coupled with the third node and having a gate coupled with the second signal, a third switch coupled with the third transistor and a fourth node, where the first control signal for the first switch activates the third switch based at least in part on the first signal having the first voltage profile over the range of the condition, and a fourth switch coupled with the fourth transistor and the fourth node, where the second control signal for the fourth switch activates the fourth switch based at least in part on the first signal having the second voltage profile over the range of the condition.

In some examples of the apparatus, the first node and the third node include a same node.

In some examples of the apparatus, an output of the circuit may be located at the fourth node and the output may be based at least in part on a difference between the first signal and the second signal.

In some examples of the apparatus, the first transistor of the first type, the second transistor of the second type, the first switch, and the second switch may be associated with a first input stage of an amplifier, and the third transistor of the first type, the fourth transistor of the second type, the third switch, and the fourth switch may be associated with a second input stage of the amplifier.

In some examples, the apparatus may include a fifth transistor of a third type coupled with a voltage source and the second node and a sixth transistor of the third type coupled with the voltage source and the fourth node, where the fifth transistor and the sixth transistor include a current mirror stage for providing current from the voltage source to the second node and the fourth node.

In some examples of the apparatus, the condition includes a temperature of a memory chip associated with the circuit, and the range includes a range of temperatures of the memory chip.

In some examples of the apparatus, the first voltage profile of the first signal includes a first temperature slope and the second voltage profile of the first signal includes a second temperature slope that may be lower than the first temperature slope.

In some examples of the apparatus, the first transistor of the first type includes a first gate oxide thickness, and the second transistor of the second type includes a second gate oxide thickness that may be different than the first gate oxide thickness.

Another apparatus is described. The apparatus may include an amplifier including a first input stage and a second input stage, where the first input stage includes, a first transistor of a first type coupled with a first node and having a gate coupled with a first signal, a second transistor of a second type coupled with the first node and having a gate coupled with the first signal, a first switch coupled with the first transistor and a second node and configured to receive a first control signal, and a second switch coupled with the second transistor and the second node and configured to receive a second control signal, where the first input stage of the amplifier is configured to switch between the first transistor of the first type being activated and the second transistor of the second type being activated, where the first transistor of the first type is configured to be activated based at least in part on the first switch receiving the first control signal and the first signal having a first voltage profile over a range of a condition, and where the second transistor of the second type is configured to be activated based at least in part on the second switch receiving the second control signal and the first signal having a second voltage profile over the range of the condition.

In some examples of the apparatus, the second input stage includes a third transistor of the first type coupled with a third node and having a gate coupled with a second signal, a fourth transistor of the second type coupled with the third node and having a gate coupled with the second signal, a third switch coupled with the third transistor and a fourth node and configured to receive the first control signal, and a fourth switch coupled with the fourth transistor and the fourth node and configured to receive the second control signal.

In some examples of the apparatus, the second input stage of the amplifier may be configured to switch between the third transistor of the first type being activated and the fourth transistor of the second type being activated, and the third transistor of the first type may be activated based at least in part on the third switch receiving the first control signal and the first signal having the first voltage profile over a range of the condition.

In some examples of the apparatus, the fourth transistor of the second type may be activated based at least in part on the fourth switch receiving the second control signal and the first signal having the second voltage profile over the range of the condition.

In some examples, the apparatus may include a fifth transistor of a third type coupled with a voltage source and the second node and a sixth transistor of the third type coupled with the voltage source and a fourth node, where the fifth transistor and the sixth transistor include a current mirror stage for providing current from the voltage source to the second node and the fourth node.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a circuit comprising:
        a first transistor of a first type coupled with a first node and having a gate coupled with a first signal;
        a second transistor of a second type coupled with the first node and having a gate coupled with the first signal;
        a first switch coupled with the first transistor and a second node, wherein a first control signal for the first switch activates the first switch based at least in part on the first signal having a first voltage profile over a range of a condition; and
        a second switch coupled with the second transistor and the second node, wherein a second control signal for the second switch activates the second switch based at least in part on the first signal having a second voltage profile over the range of the condition.

2. The apparatus of claim 1, further comprising:
    a non-volatile memory element coupled with the circuit, wherein the first control signal is configured to activate the first switch and the second control signal is configured to deactivate the second switch based at least in part on the non-volatile memory element storing a first value and the first control signal is configured to deactivate the first switch and the second control signal is configured to activate the second switch based at least in part on the non-volatile memory element storing a second value.

3. The apparatus of claim 1, wherein the circuit further comprises:
    a third transistor of the first type coupled with a third node and having a gate coupled with a second signal;
    a fourth transistor of the second type coupled with the third node and having a gate coupled with the second signal;
    a third switch coupled with the third transistor and a fourth node, wherein the first control signal for the first switch activates the third switch based at least in part on the first signal having the first voltage profile over the range of the condition;
    a fourth switch coupled with the fourth transistor and the fourth node, wherein the second control signal for the fourth switch activates the fourth switch based at least in part on the first signal having the second voltage profile over the range of the condition.

4. The apparatus of claim 3, wherein the first node and the third node comprise a same node.

5. The apparatus of claim 3, wherein an output of the circuit is located at the fourth node and the output is based at least in part on a difference between the first signal and the second signal.

6. The apparatus of claim 3, wherein
    the first transistor of the first type, the second transistor of the second type, the first switch, and the second switch are associated with a first input stage of an amplifier, and
    the third transistor of the first type, the fourth transistor of the second type, the third switch, and the fourth switch are associated with a second input stage of the amplifier.

7. The apparatus of claim 6, further comprising:
    a fifth transistor of a third type coupled with a voltage source and the second node; and
    a sixth transistor of the third type coupled with the voltage source and the fourth node, wherein the fifth transistor and the sixth transistor comprise a current mirror stage for providing current from the voltage source to the second node and the fourth node.

8. The apparatus of claim 1, wherein the condition comprises a temperature of a memory chip associated with the circuit, and
    the range comprises a range of temperatures of the memory chip.

9. The apparatus of claim 8, wherein the first voltage profile of the first signal comprises a first temperature slope and the second voltage profile of the first signal comprises a second temperature slope that is lower than the first temperature slope.

10. The apparatus of claim 1, wherein
    the first transistor of the first type comprises a first gate oxide thickness, and
    the second transistor of the second type comprises a second gate oxide thickness that is different than the first gate oxide thickness.

11. A method, comprising:
    receiving a first signal at a gate of a first transistor of a first type of a circuit, wherein the first transistor of the first type is coupled with a first node;
    receiving the first signal at a gate of a second transistor of a second type of the circuit, wherein the second transistor of the second type is coupled with the first node, wherein the first signal comprises a first voltage profile over a range of a condition or a second voltage profile over the range of the condition;
    activating a first switch coupled with the first transistor and a second node, based at least in part on the first switch receiving a first control signal and the first signal having the first voltage profile over the range of the condition;
    maintaining a second switch coupled with the second transistor and the second node in a deactivated state based at least in part on activating the first switch.

12. The method of claim 11, further comprising:
    reading data from a non-volatile memory element coupled with the circuit, wherein the first control signal is configured to activate the first switch and a second control signal is configured to deactivate the second switch based at least in part on reading a first value from the non-volatile memory element and the first control signal is configured to deactivate the first switch and the second control signal is configured to activate the second switch based at least in part on reading a second value from the non-volatile memory element.

13. The method of claim 11, wherein the first transistor, the second transistor, the first switch, and the second switch are associated with an input stage of an amplifier, the method further comprising:
  receiving an input voltage at a third node; and
  outputting, from the amplifier, an output voltage that is greater than the input voltage based at least in part on activating the first switch or activating the second switch.

14. The method of claim 11, further comprising:
  receiving an input voltage at a third node;
  comparing the input voltage with a voltage of the first signal; and
  outputting, from the circuit, an output voltage based at least in part on a difference between the input voltage and the voltage of the first signal.

15. The method of claim 11, wherein the first voltage profile of the first signal comprises a first temperature slope and the second voltage profile of the first signal comprises a second temperature slope that is different than the first temperature slope.

16. An apparatus, comprising:
  an amplifier comprising a first input stage and a second input stage, wherein the first input stage comprises:
    a first transistor of a first type coupled with a first node and having a gate coupled with a first signal;
    a second transistor of a second type coupled with the first node and having a gate coupled with the first signal;
    a first switch coupled with the first transistor and a second node and configured to receive a first control signal; and
    a second switch coupled with the second transistor and the second node and configured to receive a second control signal, wherein the first input stage of the amplifier is configured to switch between the first transistor of the first type being activated and the second transistor of the second type being activated, wherein the first transistor of the first type is configured to be activated based at least in part on the first switch receiving the first control signal and the first signal having a first voltage profile over a range of a condition, and wherein the second transistor of the second type is configured to be activated based at least in part on the second switch receiving the second control signal and the first signal having a second voltage profile over the range of the condition.

17. The apparatus of claim 16, wherein the second input stage comprises:
  a third transistor of the first type coupled with a third node and having a gate coupled with a second signal;
  a fourth transistor of the second type coupled with the third node and having a gate coupled with the second signal;
  a third switch coupled with the third transistor and a fourth node and configured to receive the first control signal; and
  a fourth switch coupled with the fourth transistor and the fourth node and configured to receive the second control signal.

18. The apparatus of claim 17, wherein
  the second input stage of the amplifier is configured to switch between the third transistor of the first type being activated and the fourth transistor of the second type being activated,
  the third transistor of the first type is activated based at least in part on the third switch receiving the first control signal and the first signal having the first voltage profile over a range of the condition.

19. The apparatus of claim 18, wherein the fourth transistor of the second type is activated based at least in part on the fourth switch receiving the second control signal and the first signal having the second voltage profile over the range of the condition.

20. The apparatus of claim 16, further comprising:
  a fifth transistor of a third type coupled with a voltage source and the second node;
  a sixth transistor of the third type coupled with the voltage source and a fourth node, wherein the fifth transistor and the sixth transistor comprise a current mirror stage for providing current from the voltage source to the second node and the fourth node.

* * * * *